US009572247B2

(12) United States Patent
Lim et al.

(10) Patent No.: US 9,572,247 B2
(45) Date of Patent: Feb. 14, 2017

(54) MEMORY CARD SYSTEMS COMPRISING FLEXIBLE INTEGRATED CIRCUIT ELEMENT PACKAGES, AND METHODS FOR MANUFACTURING SAID MEMORY CARD SYSTEMS

(71) Applicant: HANA MICRON INC., Chungcheongnam-do (KR)

(72) Inventors: Jae-Sung Lim, Cheonan-si (KR); Ju-Hyung Kim, Seoul (KR)

(73) Assignee: HANA MICRON INC., Asan-si (KR)

( * ) Notice: Subject to any disclaimer, the term of this patent is extended or adjusted under 35 U.S.C. 154(b) by 0 days.

(21) Appl. No.: 14/650,578

(22) PCT Filed: Mar. 18, 2013

(86) PCT No.: PCT/KR2013/002165
§ 371 (c)(1),
(2) Date: Jun. 9, 2015

(87) PCT Pub. No.: WO2014/092248
PCT Pub. Date: Jun. 19, 2014

(65) Prior Publication Data
US 2015/0319843 A1 Nov. 5, 2015

(30) Foreign Application Priority Data

Dec. 12, 2012 (KR) .......... 10-2012-0144282
Dec. 12, 2012 (KR) .......... 10-2012-0144300

(51) Int. Cl.
*H01L 21/00* (2006.01)
*H05K 1/02* (2006.01)
(Continued)

(52) U.S. Cl.
CPC .......... *H05K 1/028* (2013.01); *H01L 23/5387* (2013.01); *H05K 1/118* (2013.01);
(Continued)

(58) Field of Classification Search
CPC .......... H01L 23/028; H01L 2924/0002; H01L 27/108; H01L 21/8229; H05K 1/028
See application file for complete search history.

(56) References Cited

U.S. PATENT DOCUMENTS 6,027,958 A  2/2000 Vu
8,107,248 B2 1/2012 Shin et al.
(Continued)

FOREIGN PATENT DOCUMENTS

KR      10-0643756 B1   11/2006
KR   10-2008-0002507      1/2008
(Continued)

OTHER PUBLICATIONS

PCT/KR2013/002165 International Search Report, date of mailing Jun. 27, 2013, with English translation, 5 pages.

*Primary Examiner* — Elias M Ullah
(74) *Attorney, Agent, or Firm* — Daly, Crowley Mofford & Durkee, LLP

(57) ABSTRACT

A memory card system may include a flexible integrated circuit device package, an upper flexible case, a lower flexible case, a wiring structure, an anisotropic conductive film, etc. The flexible integrated circuit device package may include a material capable of being bent or folded and a flexible integrated circuit device having a connection pad for an electrical connection. The upper flexible case may include a material capable of being bent or folded and may cover the integrated circuit device package. The lower flexible case may include a material capable of being bent or folded and the flexible integrated circuit device package may be fixed to the lower flexible case. The wiring structure may include a material capable of being bent or folded, and also may include a connection wiring disposed on an inner surface of the upper flexible case for electrically connecting the flexible integrated circuit device package with an exter- (Continued)

nal device, a connection pin disposed on an outer surface of the upper flexible case, and a via wiring passing through the upper flexible case. The anisotropic conductive film may be disposed between the flexible integrated circuit device package and the upper flexible case for electrically connecting the connection pad with the connection wiring.

12 Claims, 6 Drawing Sheets

(51) Int. Cl.
    *H05K 1/11*     (2006.01)
    *H05K 3/40*     (2006.01)
    *H05K 5/00*     (2006.01)
    *H01L 23/538*     (2006.01)
    *H05K 1/18*     (2006.01)
    *H05K 3/32*     (2006.01)

(52) U.S. Cl.
    CPC ............... *H05K 1/189* (2013.01); *H05K 3/40* (2013.01); *H05K 5/0004* (2013.01); *H01L 2924/0002* (2013.01); *H05K 1/117* (2013.01); *H05K 3/323* (2013.01); *H05K 2201/10159* (2013.01); *Y10T 29/49149* (2015.01)

(56) References Cited

U.S. PATENT DOCUMENTS

| | | | |
|---|---|---|---|
| 8,198,135 | B2 | 6/2012 | Klink et al. |
| 2011/0147191 | A1 | 6/2011 | Marsanne |
| 2012/0292395 | A1 | 11/2012 | Huang et al. |
| 2015/0076683 | A1 | 3/2015 | Lim et al. |

FOREIGN PATENT DOCUMENTS

| | | |
|---|---|---|
| KR | 10-2012-0144282 B1 | 12/2012 |
| KR | 10-2012-0144300 B1 | 12/2012 |
| KR | 10-1320973 B1 | 10/2013 |
| KR | 10-1350435 B1 | 1/2014 |
| KR | 10-1451887 B1 | 10/2014 |

MEMORY CARD SYSTEMS COMPRISING FLEXIBLE INTEGRATED CIRCUIT ELEMENT PACKAGES, AND METHODS FOR MANUFACTURING SAID MEMORY CARD SYSTEMS

BACKGROUND

1. Field

The invention relates to memory card systems including flexible integrated circuit device packages and method of manufacturing memory card systems. More particularly, the invention relates to memory card systems capable of being bent and folded randomly as demands, and methods of manufacturing the memory card systems.

2. Related Technology

Recently, as electronic apparatus is widely used for many applications, packing technologies for an integrated circuit device such as a semiconductor memory device are required to ensure that a recent integrated circuit device package has a high capacity, a thin thickness, a minute size, etc. To meet the requirements of the recent integrated circuit device package, various solutions have been searched. Particularly, a flexible integrated circuit device has been developed, and thus a flexible integrated circuit device package for the flexible integrated circuit device has been developed. For example, a flexible integrated circuit device package is described in Korean Registered Patent No. 643,756.

The technologies for the flexible integrated circuit device package have not been developed to required level. Considering this problem, the inventors have invented flexible integrated circuit device packages, and have filed the invention to Korean Intellectual Property Office as assigned Korean Patent Application Nos. 2012-0043577, 2012-0043583 and 2012-0043584.

However, a memory card system including a flexible integrated circuit device package directly employed in an electronic apparatus such as a computer has not been properly developed yet.

SUMMARY

Example embodiments of the invention provide a memory card system capable of being bent or folded as desired while ensuring an improved adhesive strength and a simple configuration.

Example embodiments of the invention provide a method of manufacturing a memory card system capable of being bent or folded as desired while ensuring an improved adhesive strength and a simple configuration.

Example embodiments of the invention provide a flexible integrated circuit device package capable of being bent or folded as desired while ensuring an improved adhesive strength and a simple configuration, and a method of manufacturing the integrated circuit device package.

According to one aspect of the invention, there is provided a memory card system comprising: a flexible integrated circuit device package including a material capable of being bent or folded, the flexible integrated circuit device package comprising a flexible integrated circuit device having a connection pad for an electrical connection; an upper flexible case including a material capable of being bent or folded, the upper flexible case covering the integrated circuit device package; a lower flexible case including a material capable of being bent or folded, the flexible integrated circuit device package being fixed to the lower flexible case; a wiring structure including a material capable of being bent or folded, the wiring structure comprising a connection wiring disposed on an inner surface of the upper flexible case for electrically connecting the flexible integrated circuit device package with an external device, a connection pin disposed on an outer surface of the upper flexible case, and a via wiring passing through the upper flexible case; and an anisotropic conductive film disposed between the flexible integrated circuit device package and the upper flexible case for electrically connecting the connection pad with the connection wiring.

In example embodiments, the flexible integrated circuit device package may include a semiconductor chip, a lower substrate disposed under the semiconductor chip, and an upper substrate disposed on the semiconductor chip wherein the connection pad is disposed on the upper substrate. Here, the connection pad may include a via pad passing through the upper substrate from the semiconductor chip. The connection pad may include an anisotropic conductive film disposed between the semiconductor chip and the upper substrate so as to electrically connect the semiconductor chip with the via pad along one direction.

In example embodiments, the upper flexible case may include polyimide. Additionally, the lower flexible case may include polyimide or metal. For example, the metal may include copper, aluminum, gold or an alloy thereof.

In example embodiments, an adhesion member may be disposed between the flexible integrated circuit device package and the lower flexible case so as to fix the flexible integrated circuit device package to the lower flexible case.

According to another aspect of the invention, there is provided a method of manufacturing a memory card system. In the method, a flexible integrated circuit device package may be fixed to a lower flexible case including a material capable of being bent or folded wherein the flexible integrated circuit device package includes a material capable of being bent or folded and comprises a connection pad for an electrical connection. An upper flexible case including a material capable of being bent or folded may be combined with the lower flexible case wherein the upper flexible case covers the flexible integrated circuit device package and comprises an anisotropic conductive film electrically connected to the connection pad.

In example embodiments, the lower flexible case may include polyimide or metal, and the upper flexible case may include a flexible printed circuit board.

In fixing of the flexible integrated circuit device package according to example embodiments, an adhesion member may be formed between the flexible integrated circuit device package and the lower flexible case.

In combining the upper flexible case with the lower flexible case according to example embodiments, a compression process may be performed using at least one roller.

In example embodiments, after combining the upper flexible case with the lower flexible case, a thermal compression process may be performed about the anisotropic conductive film to improve an adhesive strength of the anisotropic conductive film and to uniformly distribute conductive particles of the anisotropic conductive film.

According to another aspect of the invention, there is provided a method of manufacturing a memory card system. In the method, a flexible integrated circuit device package may be fixed to an upper flexible case including a material capable of being bent or folded wherein the upper flexible case comprises an anisotropic conductive film and the flexible integrated circuit device package comprises a connection pad electrically connected to the anisotropic conductive film. The upper flexible case may be combined with a lower flexible case including a material capable of being bent or folded wherein the flexible integrated circuit device package is interposed between the lower flexible case and the upper flexible case.

In combining the upper flexible case with the lower flexible case according to example embodiments, an adhesion member may be formed between the lower flexible case and the flexible integrated circuit device package.

In example embodiments, after combining the upper flexible case with the lower flexible case, a thermal compression process may be performed about the anisotropic conductive film to improve an adhesive strength of the anisotropic conductive film and to uniformly distribute conductive particles of the anisotropic conductive film.

In example embodiments, after the thermal compression process, a filling member may be formed in spaces generated among adjacent flexible integrated circuit device packages using a flexible material.

According to still another aspect of the invention, there is provided a flexible integrated circuit device package comprising: a lower substrate including a flexible material capable of being bent or folded; a flexible integrated circuit device disposed on the lower substrate, the flexible integrated circuit device including a flexible material capable of being bent or folded and comprising a connection terminal for an electrical connection; an upper substrate including flexible material capable of being bent or folded and comprising a connection pad electrically connected to the connection terminal; and an anisotropic conductive film disposed between the flexible integrated circuit device and the upper substrate to electrically connect the connection terminal with the connection pad in one direction.

In example embodiments, the flexible integrated circuit device may have a thickness in a range of 1 μm to 50 μm.

In example embodiments, the upper substrate may include polyimide, and the connection pad may include a via wiring passing through the upper substrate and an extended wiring connected to the via wiring and extended along an inner surface of the upper substrate.

In example embodiments, an adhesion member may be disposed between the lower substrate and the flexible integrated circuit device to fix the flexible integrated circuit device on the lower substrate.

According to still another aspect of the invention, there is provided a method of manufacturing a flexible integrated circuit device package. In the method, a flexible integrated circuit device may be attached to a lower substrate including a flexible material capable of being bent or folded by a transfer process wherein the flexible integrated circuit device includes a flexible material capable of being bent or folded and comprises a connection terminal for an electrical connection. An upper substrate may be combined with the lower substrate wherein the upper substrate includes a flexible material capable of being bent or folded and comprises an anisotropic conductive film electrically connected to the connection terminal.

In attaching the flexible integrated circuit device to the lower substrate according to example embodiments, an adhesion member may be formed between the lower substrate and the flexible integrated circuit device.

In example embodiments, the upper substrate may be combined with the lower substrate by a compression process using rollers.

In example embodiments, after combining the upper substrate with the lower substrate, a thermal compression process may be performed about the anisotropic conductive film to improve an adhesive strength of the anisotropic conductive film and to uniformly distribute conductive particles of the anisotropic conductive film.

According to the memory card system of example embodiments of the invention, all the components such as the flexible integrated circuit device package and the lower and the upper flexible cases having the flexible integrated circuit device package therebetween may include the flexible materials. Thus, the memory card system may be totally bent or folded randomly as required. This memory card system may be advantageously used at a bent or folded position so that the memory card system may be employed in various electronic apparatuses. Additionally, the memory card system according to example embodiments may include the anisotropic conductive film for electrically connecting the flexible integrated circuit device package with an external device. Therefore, the memory card system may have a simpler configuration as well as an improved structural stability by enhancing an adhesive strength because of the anisotropic conductive film. In the flexible integrated circuit device package according to example embodiments of the invention, all the components such as the flexible integrated circuit device, the lower substrate and the upper substrate may include the flexible materials, so that the flexible integrated circuit device package may be totally bent or folded randomly as desired. Accordingly, the flexible integrated circuit device package may be widely applied at a bent or folded position in a predetermined form. Furthermore, the flexible integrated circuit device package may include the anisotropic conductive film for electrically connecting the flexible integrated circuit device with the upper substrate, such that the flexible integrated circuit device package may have a simple configuration without an additional adhesion member and also may have a more stable structure because of the adhesive strength of the anisotropic conductive film.

DESCRIPTION OF EMBODIMENTS

Figure 1:
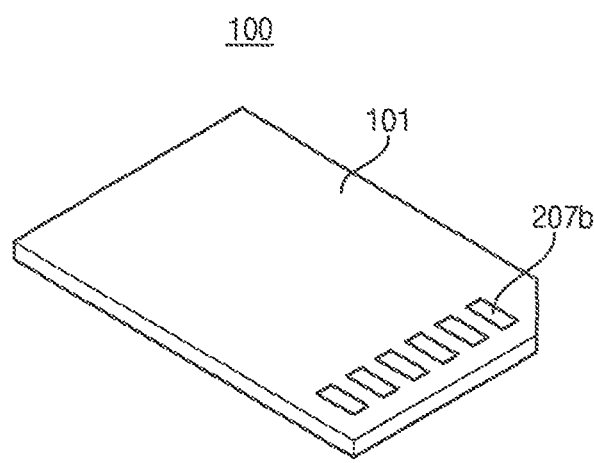
FIG. 1 is a perspective view illustrating memory card system in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

Like numerals refer to like elements throughout. As used herein, the term "and/or" includes any and all combinations of one or more of the associated listed items. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention. The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
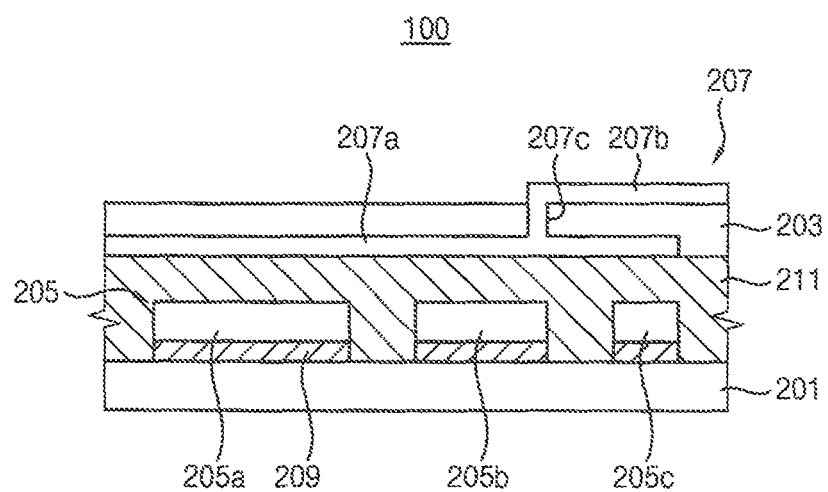
FIG. 2 is a cross-sectional view illustrating a memory card system in accordance with example embodiments of the invention.

FIG. 1 is a perspective view illustrating a memory card system in accordance with example embodiments of the invention. FIG. 2 is a cross-sectional view illustrating a memory card system in accordance with example embodiments of the invention.

Referring to FIGS. 1 and 2, a memory card system 100 according to example embodiments may include a case 101 and a flexible integrated circuit device package 205 installed in the case 101. For example, the memory card system 100, besides a secure digital (SD) cars illustrated in FIG. 1, may additionally include a multimedia card, a compact flash memory, a smart media card, a memory stick, etc.

The case 101 may include a lower flexible case 201 and an upper flexible case 203. In example embodiments, the flexible integrated circuit device package 205 may be mounted in the case 101 including the lower and the upper flexible cases 201 and 203. For example, the flexible integrated circuit device package 205 may be inserted along with additional components between the lower flexible case 201 and the upper flexible case 203. The lower flexible case 201 may include a flexible material capable of being bent or folded randomly. According to example embodiments, the lower flexible case 201 may include relatively high heat resisting polyimide or metal such that the lower flexible case 201 may have a sufficient heat resistance in a thermal compression process. Examples of the metal included in the lower flexible case 201 may include copper (Cu), aluminum (Al), gold (Au) or an alloy of these metals. These may be used alone or in a mixture thereof. Further, the memory card system 100 may ensure a proper heat dissipation property when the lower flexible case 201 includes the metal.

The flexible integrated circuit device package 205 may be located on the lower flexible case 201. Although it is not illustrated, the flexible integrated circuit device package 205 may include at least one connection pad for an electrical connection. In this case, the connection pad of the flexible integrated circuit device package 205 may be spaced apart from an upper face of the lower flexible case 201 where a bottom face of the flexible integrated circuit device package 205 contacts. For example, the connection pad may be exposed from an upper face of the flexible integrated circuit device package 205.

At least one adhesion member 209 may be disposed between the lower flexible case 201 and the flexible integrated circuit device package 205. The adhesion member 209 may serve to fix the flexible integrated circuit device package 205 onto the lower flexible case 201. For example, the adhesion member 209 may include a tape for bonding of a die containing a flexible material.

The upper flexible case 203 may substantially cover the flexible integrated circuit device package 205, and may include a flexible material capable of being bent or folded. The upper flexible case 203 may electrically insulate the flexible integrated circuit device package 205 from a wiring structure 207 which may be integrally disposed with the upper flexible case 203. In example embodiments, the upper flexible case 203 may include polyimide so as to ensure a sufficient heat resistance and a proper electric insulation property. The wiring structure 207 may be electrically connected to the connection pad of the flexible integrated circuit device package 205. To this end, the connection pad of the flexible integrated circuit device package 205 may be positioned between an inside of the upper flexible case 203 and the upper face of the flexible integrated circuit device package 205.

As illustrated in FIG. 2, the flexible integrated circuit device package 205 may include a flexible material capable of being bent or folded randomly. In example embodiments, the flexible integrated circuit device package 205 may include a memory device package 205a, an interface device package 205b for a communication to an outside, a driving circuit device package 205c for driving the memory device package 205a, etc. Further, the flexible integrated circuit device package 205 may include a substrate containing a flexible material for mounting the memory device package 205a, the interface device package 205b and the driving circuit device package 205c thereon.

The memory card system 100 may include the wiring structure 207 for an electrical connection between external devices and the flexible integrated circuit device package 205 installed in the case 101. In example embodiments, the wiring structure 207 may include a connection wiring 207a, a connection pin 207b and a via wiring 207c. The connection wiring 207a may be disposed on an inner surface of the upper flexible case 203, and the connection pin 207b may be located on an outer surface of the upper flexible case 203. Additionally, the via wiring 207c may pass through the upper flexible case 203, and then may electrically connect the connection wiring 207a with the connection pin 207b. Here, the connection wiring 207a may be substantially buried in the inner surface of the upper flexible case 203, and the connection pin 207b may be at least partially buried in the outer surface of the upper flexible case 203. The wiring structure 207 may include a material ensuring a proper electrical conductivity and a sufficient flexibility. For example, each of the connection wiring 207a, the connection pin 207b and the via wiring 207c may include metal having a good ductility such as copper, aluminum, gold, etc.

In the memory card system 100 according to example embodiments, the connection pad of the flexible integrated circuit device package 205 is electrically connected to the connection wiring 207 of the wiring structure 207, so that the flexible integrated circuit device package 205 installed in the case 101 may be electrically connected to the external devices. As fully illustrated in FIG. 1, the connection pin 207b of the wiring structure 207 may be at least partially exposed from the outer surface of the upper flexible case 203 to thereby be electrically connected to the external devices such as a computer.

According to example embodiments, the memory card system 100 may include an anisotropic conductive film (ACF) 211 for electrically connecting the connection pad of the flexible integrated circuit device package 205 with the connection pad wiring 207a of the wiring structure 207. As illustrated in FIG. 2, the anisotropic conductive film 211 may be disposed between the lower flexible case 201 and the upper flexible case 203. That is, the anisotropic conductive film 211 may be positioned on the lower flexible case 201 to substantially cover the flexible integrated circuit device package 205.

The anisotropic conductive film 211 may be obtained by uniformly dispersing electrical conductive particles in an adhesive organic material having an electric insulation property, and then by forming them in a film shape. The anisotropic conductive film 211 may have a predetermined electrical conductivity along a thicknesswise direction thereof while having an electric insulation layer property along a lengthwise direction thereof. Accordingly, the anisotropic conductive film 211 may allow a current to pass therethrough in one direction.

In example embodiments, the anisotropic conductive film 211 may also include a flexible material capable of being bent or folded. When the above anisotropic conductive film 211 is disposed between the flexible integrated circuit device package 205 and the upper flexible case 203, the current may flow between the connection pad of the flexible integrated circuit device package 205 and the connection wiring 207a of the wiring structure 207 along the thicknesswise direction of the anisotropic conductive film 211. In other words, the current may flow in one direction between the connection pad of the flexible integrated circuit device package 205 and the connection wiring 207a of the wiring structure 207 by applying the anisotropic conductive film 211 therebetween. Further, the anisotropic conductive film 211 may have a predetermined adhesive strength, such that the flexible integrated circuit device package 205 may be combined with the upper flexible case 203 with an improved adhesive strength. Here, the anisotropic conductive film 211 may make contact with the connection wiring 207a of the wiring structure 207 and the upper flexible case 203 while substantially covering the upper face of the flexible integrated circuit device package 205. Moreover, the flexible integrated circuit device package 205 may have a simple configuration for the electrical connection with the external devices because the anisotropic conductive film 211 may be located between the connection pad of the flexible integrated circuit device package 205 and the connection wiring 207a of the wiring structure 207. Additionally, costs of manufacturing the memory card system 100 may be reduced because an additional adhesion member for fixing the flexible integrated circuit device package 205 to the upper flexible case 203 may not be required due to the use of the anisotropic conductive film 211.

As described above, the memory card system 100 according to example embodiments may include the flexible integrated circuit device package 205, the upper flexible case 203, the lower flexible case 201, the adhesion member 209 and the wiring structure 207, all of which may include flexible materials. Thus, the memory card system 100 may be entirely bent or folded in an arbitrary shape as occasion demands.

Figure 3:
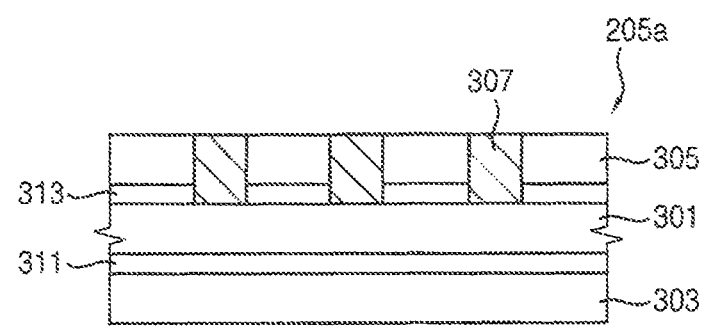
FIGS. 3 and 4 are cross-sectional views illustrating a flexible integrated circuit device package in accordance with example embodiments of the invention.
Figure 4:
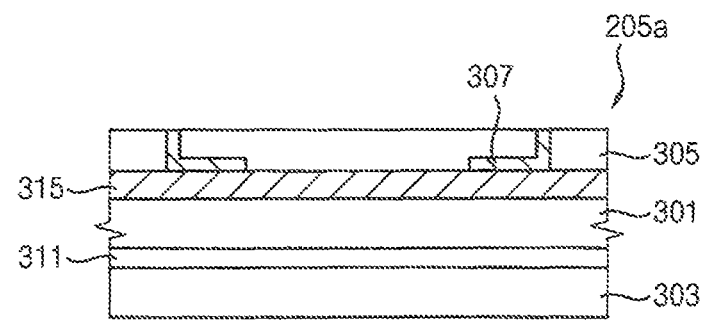

FIGS. 3 and 4 are cross-sectional views illustrating a flexible integrated circuit device package in accordance with example embodiments. For example, the flexible integrated circuit device package in FIGS. 3 and 4 may be employed in the memory card system 100 described with reference to FIG. 1.

Referring to FIG. 3, the flexible integrated circuit device package may include a memory device package 205a. In this case, the memory device package 205a may include a lower substrate 303, a lower adhesion member 311, a semiconductor chip 301, an upper adhesion member 313, an upper substrate 305, at least one connection pad 307, etc. The memory device package 205a may have a flexibility to be bent or folded, and thus the lower substrate 303, the lower adhesion member 311, the semiconductor chip 301, the upper adhesion member 313, the upper substrate 305 and the connection pad 307 may include flexible materials capable of being bent or folded, respectively.

In example embodiments, the semiconductor chip 301 may include a memory chip. In some example embodiments, the semiconductor chip 301 may include a driving circuit chip when the flexible integrated circuit device package includes the driving circuit device package 205c (see FIG. 2). In other example embodiments, the semiconductor chip 301 may include an interface circuit chip when the flexible integrated circuit device package includes the interface circuit device package 205b (see FIG. 2).

Although FIGS. 3 and 4 illustrate the flexible integrated circuit device package includes the memory device package 205a, the flexible integrated circuit device package may further include the driving circuit device package 205c and the interface circuit device package 205b as shown in FIG. 2.

Referring to FIG. 3 again, the semiconductor chip 301 may be disposed between the lower substrate 303 and the upper substrate 305. In example embodiments, the lower adhesion member 311 may be interposed between the lower substrate 303 and the semiconductor chip 301, and the upper adhesion member 313 may be positioned between the semiconductor chip 301 and the upper substrate 305. The lower and the upper adhesion members 311 and 313 may substantially fix the semiconductor chip 301 to the lower and the upper substrates 303 and 305, respectively.

The at least one connection pad 307 may be a via pad having a shape passing through the upper substrate 305. For example, the connection pad 307 may be in a form exposed by a surface of the upper substrate 305 from an electrical terminal of the semiconductor chip 301. In example embodiments, the memory device package 205a may electrically connect the semiconductor chip 301 to external devices using an anisotropic conductive film (not illustrated) which may be disposed on the connection pad 307.

The flexible integrated circuit device package illustrated in FIG. 4 may also include a memory device package 205a. The memory device package 205a may have a configuration substantially the same as that of the memory device package 205a described with reference to FIG. 3 except an anisotropic conductive film 315 disposed between a semiconductor chip 301 and an upper substrate 305. In FIG. 4, like reference numerals designate like elements which are the same as those described with reference to FIG. 3.

Referring to FIG. 4, the memory device package 205a may include the anisotropic conductive film 315 disposed between the semiconductor chip 301 and the upper substrate 305. The anisotropic conductive film 315 may be interposed between a connection terminal (not illustrated) of the semiconductor chip 301 and a connection pad 307 of the upper substrate 305. The connection pad 307 may have a portion passing through the upper substrate 305 and a portion exposed from a bottom face of the upper substrate 305. The anisotropic conductive film 315 may be located between the electrical terminal of the semiconductor chip 301 and the exposed portion of the connection pad 307.

In example embodiments, the anisotropic conductive film 315 may have a predetermined adhesive strength, so that the upper adhesion member 313 for fixing the semiconductor chip 301 to the upper substrate 305 as described in FIG. 3 may not be required. Further, in case of the memory device package 205a illustrated in FIG. 4, the connection pad 307 electrically connected to the electrical terminal of the semiconductor chip 301 may be extended along the bottom face of the upper substrate 305 so as to achieve more stable electrical connection. The flexible integrated circuit device package of the memory card system may have various configurations by the combinations of various elements besides the elements illustrated in FIGS. 2 to 4.

As described above, the memory card system according to example embodiments may include the elements containing the flexible materials such as the flexible integrated circuit device package, the lower flexible case and the upper flexible case, so that the memory card system may be entirely bent or folded as occasion demands. Further, the memory card system according to example embodiments may include the anisotropic conductive film for electrically connecting the flexible integrated circuit device package with the external devices. Hence, the memory card system may have a simple and stable configuration because some of adhesion members for fixing of the flexible integrated circuit device package may not be required.

Figure 5:
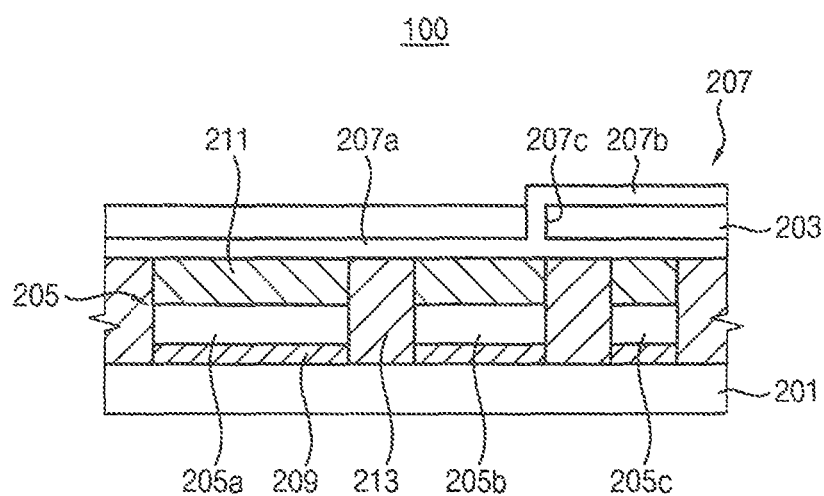
FIG. 5 is a cross-sectional view illustrating a memory card system in accordance with some example embodiments of the invention.

FIG. 5 is a cross-sectional view illustrating a memory card system in accordance with some example embodiments of the invention. The memory card system 100 illustrated in FIG. 5 may have a configuration substantially the same as that of the memory card system 100 described with reference to FIGS. 1 and 2 except at least one filling member 213. In FIG. 5, like reference numerals designate like elements the same as those described with reference to FIGS. 1 and 2.

Referring to FIG. 5, the memory card system 100 may include the filling member 213 which may fill spaces provided among flexible integrated circuit device packages 205. Similarly, the flexible integrated circuit device package 205 may include a memory device package 205a, a driving circuit device package 205b and an interface circuit device package 205c as described above. In this case, the filling members 213 may substantially fill the spaces among these device packages 205a, 205b and 205c. The filling members 213 may substantially fill the spaces among the flexible integrated circuit device packages 205 generated in manufacturing processes for the memory card system 100. In example embodiments, the filling member 213 may include a flexible material.

As described above, the memory card system according to example embodiments may ensure a predetermined flexibility capable of being bent or folded with various configurations. Further, the memory card system may have a simple structure and the electrical stability among the components thereof may be improved because the memory card system may include the anisotropic conductive film.

Figure 6:
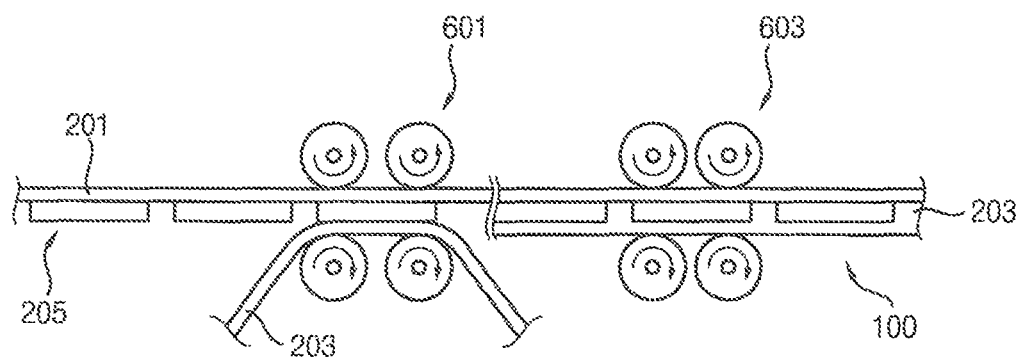
FIG. 6 is a cross-sectional view illustrating a method of manufacturing a memory card system in accordance with some example embodiments of the invention.

FIG. 6 is a cross-sectional view illustrating a method of manufacturing a memory card system in accordance with some example embodiments of the invention. Although a memory card system illustrated in FIG. 6 may have a configuration substantially the same as that of the memory card system 100 described with reference to FIGS. 1 and 2, a memory card system having a configuration substantially the same as those of the memory card systems illustrated in FIGS. 3 to 5 may be manufactured based on variations and/or modifications apparent to those ordinary skilled in the art.

Referring to FIG. 6, after providing a lower flexible case 201, a flexible integrated circuit device package 205 may be fixed to the lower flexible case 201. In this case, the flexible integrated circuit device package 205 may be attached to the lower flexible case 201 so that a connection pad (not illustrated) of the flexible integrated circuit device package 205 is exposed. In example embodiments, the flexible integrated circuit device package 205 may be combined with by a die bonding process. For example, the flexible integrated circuit device package 205 may be combined with the lower flexible case 201 using an adhesion member (not illustrated) including a tape for die bonding or a double-sided tape. The flexible integrated circuit device package 205 may include a memory device package, a driving circuit device package, an interface circuit device package, etc.

An upper flexible case 203 may be combined with the lower flexible case 201 having the flexible integrated circuit device package 205 thereon. Hence, the flexible integrated circuit device package 205 may be interposed between the lower flexible case 201 and the upper flexible case 203. Although it is not illustrated, a wiring structure including a connection wiring, a via wiring and a connection pin may be integrally provided with the upper flexible case 203. For example, the upper flexible case 203 may include a flexible printed circuit board.

In example embodiments, an anisotropic conductive film (not illustrated) may be attached to a bottom face of the upper flexible case 203 opposing to the lower flexible case 201. As described above, the anisotropic conductive film may substantially cover the flexible integrated circuit device package 205, and may fix the upper flexible case 203 to the lower flexible case 201. With such anisotropic conductive film, the connection pad of the flexible integrated circuit device package 205 may be electrically connected to the wiring structure of the upper flexible case 203.

As illustrated in FIG. 6, the upper flexible case 203 may be combined with the lower flexible case 201 using at least one roller. That is, the lower flexible case 201 and the upper flexible case 203 may be compressed each other using rollers 601 while transferring the lower flexible case 201 on which the flexible integrated circuit device package 205 is fixed and the upper flexible case 203 on which the anisotropic conductive film is attached between the rollers 601. Thus, the lower flexible case 201 and the upper flexible case 203 may be combined each other.

In some example embodiments, after combining the upper flexible case 203 with the lower flexible case 201, a thermal compression process may be performed about the lower and the upper flexible cases 201 and 203 so as to improve an adhesive strength of the anisotropic conductive film and to uniformly distribute conductive particles of the anisotropic conductive film. For example, as illustrated in FIG. 6, the thermal compression process may be carried our using rollers 603 which may heat the anisotropic conductive film interposed between the lower flexible case 201 and the upper flexible case 203.

When the thermal compression process is executed at a temperature below 100° C., the anisotropic conductive film may not be sufficiently heated. In case that the thermal compression process is performed at a temperature above 200° C., thermal stresses may be generated in the flexible integrated circuit device package 205, the lower flexible case 201 and/or the upper flexible case 203. Accordingly, the thermal compression process may be carried out at a temperature in a range of about 100° C. to about 200° C.

In example embodiments, the lower flexible case 201 may include polyimide or metal and the upper flexible case 203 may include polyimide in order to have sufficient heat resistances during the thermal compression process. In one example embodiment, the memory card system may have a proper heat dissipation property when the lower flexible case 201 includes metal. Additionally, when the upper flexible case 203 includes polyimide, the wiring structure may be integrally formed with the upper flexible case 203 while ensuring a desired flexibility of the upper flexible case 203.

As described above, after the flexible integrated circuit device package 205 is fixed to the lower flexible case 201, the upper flexible case 203 may be combined with the lower flexible case 201 by the thermal compression process using the rollers 601. Then, the thermal compression process may be performed about the anisotropic conductive film between the lower flexible case 201 and the upper flexible case 203, so that the memory card system may be obtained.

In the method of manufacturing the memory card system illustrated in FIG. 6, the thermal compression process may be executed about the anisotropic conductive film between the lower and the upper flexible cases 201 and 203 after combining the upper flexible case 203 with the lower flexible case 201. Hence, the anisotropic conductive film may substantially fill spaces near the flexible integrated circuit device package 205 by the thermal compression process without requiring an additional filling member even though the spaces are generated in the combination of the lower and the upper flexible cases 201 and 203.

Figure 7:
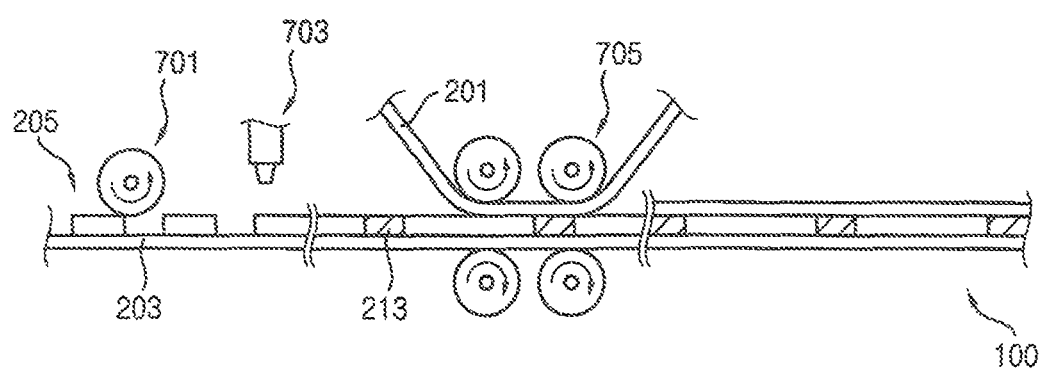
FIG. 7 is a cross-sectional view illustrating a method of manufacturing a memory card system in accordance with some example embodiments of the invention.

FIG. 7 is a cross-sectional view illustrating a method of manufacturing a memory card system in accordance with some example embodiments of the invention. A memory card system illustrated in FIG. 7 may have a configuration substantially the same as that of the memory card system 100 described with reference to FIG. 5, however, a memory card system having a configuration substantially the same as those of the memory card systems illustrated in FIGS. 1 to 4 may be manufactured based on variations and/or modifications apparent to those ordinary skilled in the art.

Referring to FIG. 7, a flexible integrated circuit device package 205 may be fixed on an upper flexible case 203. In example embodiments, an anisotropic conductive film (not illustrated) may be disposed on the upper flexible case 203. Here, a connection pad 307 of the flexible integrated circuit device package 205 may contact the anisotropic conductive film. When the anisotropic conductive film is interposed between the flexible integrated circuit device package 205 and the upper flexible case 203, an additional adhesion member for fixing of the flexible integrated circuit device package 205 may not be required. For example, the flexible integrated circuit device package 205 may be combined with the upper flexible case 203 by a thermal compression process.

Although it is not shown, a wiring structure including a connection wiring, a via wiring and a connection pin may be integrally formed with the upper flexible case 203. For example, the upper flexible case 203 illustrated in FIG. 7 may include a flexible printed circuit board.

After fixing the flexible integrated circuit device package 205 to the upper flexible case 203, a thermal compression process may be executed about the anisotropic conductive film in order to enhance an adhesive strength of the anisotropic conductive film and also to uniformly distribute conductive particles of the anisotropic conductive film between the upper flexible case 203 and the flexible integrated circuit device package 205. Such thermal compression process may be carried out using at least one roller 701 capable of heating the upper flexible case 203 having the anisotropic conductive film thereon. As described above, when the thermal compression process is carried out at a temperature below 100° C., the efficiency of the process may be poor because the anisotropic conductive film may not be properly heated. When the thermal compression process is performed at a temperature above 200° C., thermal stresses may be generated in the flexible integrated circuit device package 205, the upper flexible case 203 and the wiring structure. Therefore, the thermal compression process may be executed at a temperature in a range of about 100° C. to about 200° C. In this thermal compression process, the upper flexible case 203 may include polyimide for ensuring a proper heat resistance. Here, the wiring structure may be easily integrally formed with the upper flexible case 203.

In case that the thermal compression process is performed about the anisotropic conductive film, a space may be generated near a side of the flexible integrated circuit device package 205 fixed on the upper flexible case 203. For example, space(s) may be formed among a memory device package, a driving circuit device package and an interface circuit device package fixed on the upper flexible case 203. In example embodiments, after performing the thermal compression process on the anisotropic conductive film, at least one filling member 213 may be formed in the space(s) using a dispenser 703. For example, the filling member 213 may be formed using a flexible material provided from the dispenser 703.

After forming of the filling member 213, the upper flexible case 203 on which the flexible integrated circuit device package 205 is fixed may be combined with a lower flexible case 201. Thus, the flexible integrated circuit device package 205 may be installed between the lower flexible case 201 and the upper flexible case 203. The lower flexible case 201 may be combined with the upper flexible case 203 using at least one roller 705. For example, while the lower flexible case 201 and the upper flexible case 203 having the flexible integrated circuit device package 205 are transferred between the rollers 705, the lower and the upper flexible cases 201 and 203 may be compressed using the rollers 705 thereby combining the upper flexible case 203 with the lower flexible case 201.

As described above, the thermal compression process may be executed about the anisotropic conductive film after fixing the flexible integrated circuit device package 205 to the upper flexible case 203. The filling member 213 may be formed to fill the space adjacent to the flexible integrated circuit device package 206 using the dispenser 703, and then the upper flexible case 203 may be combined with the lower flexible case 201 by the thermal compression process using the rollers 705. Accordingly, the memory card system may be obtained.

In the memory card systems and the methods of manufacturing the memory card systems according to example embodiments, all the components including the flexible integrated circuit device packages, the lower flexible cases and the upper flexible cases may include flexible materials, so that the memory card systems may be entirely bent or folded randomly as desired. Because these memory card systems may be advantageously used at bent or folded positions, the memory card systems may be employed in various electric or electronic apparatuses. Additionally, the memory card systems may use the anisotropic conductive films for electrical connecting the flexible integrated circuit device packages with the external devices, such that the memory card systems may have simple configurations without adhesion member(s) for fixing of the flexible integrated circuit device packages. Furthermore, the memory card systems may ensure improved structural stabilities because of the adhesive strength of the anisotropic conductive films.

Figure 8:
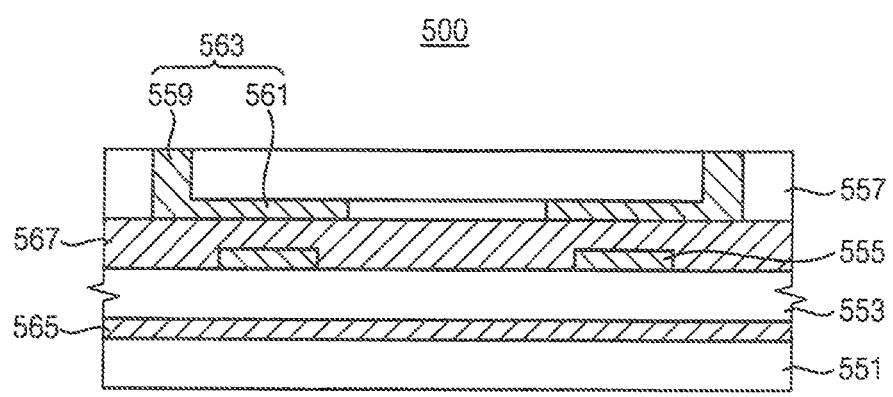
FIG. 8 is a cross-sectional view illustrating a flexible integrated circuit device package in accordance with some example embodiments of the invention.

FIG. 8 is a cross-sectional view illustrating a flexible integrated circuit device package in accordance with some example embodiments of the invention.

Referring to FIG. 8, a flexible integrated circuit device package 500 may be employed in a memory card system, for example, an SD card, a multimedia card, a smart media card, a memory stick, etc. When a case of the memory card system in which the flexible integrated circuit device package 500 is installed includes a flexible material capable of being bent or folded, the memory card system may be totally bent or folded as desired.

The flexible integrated circuit device package 500 may include a lower substrate 551, a flexible integrated circuit device 553, an adhesion member 565, an anisotropic conductive film 567, etc.

The flexible integrated circuit device 553 may be disposed on the lower substrate 551. The lower substrate 551 may include a flexible material capable of being bent or folded. For example, the lower substrate 551 may include polyimide or metal. Examples of the metal for the lower substrate 551 may include copper, aluminum, gold, an alloy of these metals, etc. When the lower substrate 551 includes polyimide or metal, the lower substrate 551 may have a sufficient beat resistance during a thermal compression process to the anisotropic conductive film 567, and may properly dissipate a heat generated in the flexible integrated circuit device package 500.

The flexible integrated circuit device 553 may be attached to the lower substrate 551 while exposing a connection terminal 555 of the flexible integrated circuit device 553 for an electrical connection to an external device. In this case, an adhesion member 565 may be provided between the lower substrate 551 and the flexible integrated circuit device 553 so as to fix the flexible integrated circuit device 553 to the lower substrate 551. For example, the adhesion member 565 may include a flexible material such as a double-sided tape or a tape for die bonding.

The anisotropic conductive film 567 may be disposed on the flexible integrated circuit device 553. Here, the anisotropic conductive film 567 may substantially cover the connection terminal 555 of the flexible integrated circuit device 553.

The upper substrate 557 may be located on the anisotropic conductive film 567. The upper substrate 557 may also include a flexible material capable of being randomly bent or folded. In example embodiments, the upper substrate 557 may have a predetermined heat resistance in the thermal compression process, and may have an electric insulation property for a connection pad 563. Thus, the upper substrate 557 may include a heat resistive and electrically insulation material. For example, the upper substrate 557 may include polyimide.

In example embodiments, the upper substrate 557 and the connection pad 563 may be substantially integrally formed. The connection pad 563 may include a via wiring 559 passing through the upper substrate 557, and an extended wiring 561 contacting the via wiring 559 and being exposed from an outer surface of the upper substrate 557. The extended wiring 561 of the connection pad 563 may be electrically connected to the connection terminal 555 of the flexible integrated circuit device 553 through the anisotropic conductive film 567. In this case, a current may flow between the connection terminal 555 and the extended wiring 561 along a thicknesswise direction of the flexible integrated circuit device package 500 by the anisotropic conductive film 567.

In example embodiments, the flexible integrated circuit device 553 may have a relatively thin thickness capable of being randomly bent or folded as occasion demands. For example, the flexible integrated circuit device 553 may have a thin thickness in a range of between several micrometers to scores of micrometers. In one example embodiment, the flexible integrated circuit device 553 may have a thickness in a range of about 1 µm to about 30 µm.

Hereinafter, it will be described a method of manufacturing a flexible integrated circuit device having a relatively thin thickness in a range of, for example, about lIpm to about 50 µm.

Integrated circuit devices may be formed on a semiconductor substrate for forming the flexible integrated circuit devices 553. The integrated circuit devices may be formed on the semiconductor substrate with a pre-cut arrangement so as to separate one another. For example, the integrated circuit devices may be individually separated by pre-cutting non-device regions of the semiconductor substrate among the integrated circuit devices.

After a protection tape may be attached onto faces of the integrated circuit devices on which the connection pad 555 is disposed, a rear portion of the semiconductor substrate may be partially removed to form the flexible integrated circuit devices 553. For example, a polishing process may be performed about a rear surface of the semiconductor substrate. In this case, the polishing process may be carried out until each of the integrated circuit devices has a thin thickness properly served as the flexible integrated circuit device 553. For example, the integrated circuit device may have a thickness in a range of about 1 µm to about 50 µm by the polishing process. In example embodiments, the flexible integrated circuit device 553 obtained by the polishing process may include a memory device, a driving circuit device, an interface circuit device, etc.

Referring to FIG. 8 again, the connection terminal 555 of the flexible integrated circuit device 553, which may be electrically connected to the connection pad 563 of the upper substrate 557, may be substantially integrally formed with the flexible integrated circuit device 553. For example, the connection terminal 555 may have various structures such as a bump, a ball, a stud, etc.

The connection pad 563 may include a via wiring 559 exposed from the outer surface of the upper substrate 557 after passing through the upper substrate 557. The extended wiring 561 may be formed from this via wiring 559 along an inner surface of the upper substrate 557. The connection terminal 555 of the flexible integrated circuit device 553 may be electrically connected to the extended wiring 561 through the anisotropic conductive film 567.

According to example embodiments, the connection pad 563 may include the extended wiring 561 so that the connection pad 563 may be easily electrically connected to the connection terminal 555 of the flexible integrated circuit device 553. For example, the extended wiring 561 may have a relatively large width such that a contact area between the extended wiring 561 and the anisotropic conductive film 567 may be increased. Thus, the connection terminal 555 and the connection pad 563 may be electrically connected by the anisotropic conductive film 567 with improved electrical connection stability. The connection pad 563 may include metal having a good ductility, for example, copper, aluminum, gold, an alloy thereof, etc.

When the connection pad 563 is integrally formed with the upper substrate 557, the upper substrate 557 may include a flexible printed circuit board of polyimide having the connection pad 563 thereon. The connection pad 563 of the upper substrate 557 may be electrically connected to the connection terminal 555 of the flexible integrated circuit device 553 using the anisotropic conductive film 567 as described above. The anisotropic conductive film 576 may be formed in a film shape after uniformly dispersing conductive particles in an adhesive organic material. The anisotropic conductive film 567 may have an electrical conductivity along a thicknesswise direction thereof whereas may have an electric insulation property in a lengthwise direction thereof. Hence, the current may flow through the anisotropic conductive film 567 along one direction only. This anisotropic conductive film 567 may also have a flexibility capable of being bent or folded randomly. In case that the anisotropic conductive film 567 may be interposed between the flexible integrated circuit device 553 and the upper substrate 557, an adhesive strength between the flexible integrated circuit device 553 and the upper substrate 557 may be enhanced while electrically connecting the connection pad 557 of the upper substrate 557 with the connection terminal 555 of the flexible integrated circuit device 553. As such, the flexible integrated circuit device package 500 including the anisotropic conductive film 567 may have a simple configuration because the adhesion member for fixing the flexible integrated circuit device 553 to the upper substrate 557 may be omitted. Thus, cost for manufacturing the flexible integrated circuit device package 500 may be reduced.

As described above, the flexible integrated circuit device package 500 according to example embodiments may be totally bent or folded because the flexible integrated circuit device package 500 may include flexible components such as the flexible integrated circuit device 553, the lower substrate 551, the upper substrate 557, the adhesion member 563 and the anisotropic conductive film 567. When the memory card system has a flexible case in which the flexible integrated circuit device package 500 is installed, the memory card system may also be entirely bent or folded so that the memory card system may be easily applied at bent or folded positions of various electronic apparatuses.

Hereinafter, it will be described a method of manufacturing a flexible integrated circuit device package according to example embodiments of the invention.

Figure 9:
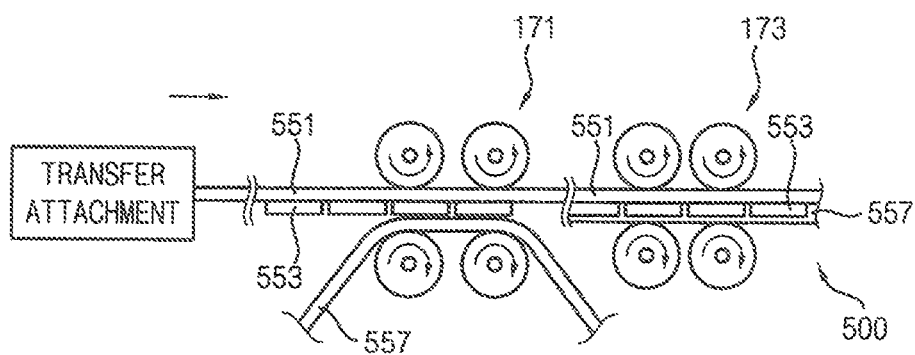
FIG. 9 is a cross-sectional view illustrating a method of manufacturing a flexible integrated circuit device package in accordance with example embodiments of the invention.

FIG. 9 is a cross-sectional view illustrating a method of manufacturing a flexible integrated circuit device package in accordance with example embodiments of the invention. A flexible integrated circuit device package illustrated in FIG. 9 may have a configuration substantially the same as that of the flexible integrated circuit device package 500 described with reference to FIG. 8, however, a flexible integrated circuit device package having a configuration substantially the same as those of the flexible integrated circuit device packages illustrated in FIGS. 2 to 5 may be manufactured based on variations and/or modifications apparent to those ordinary skilled in the art.

Referring to FIG. 9, after providing a lower substrate 551, a flexible integrated circuit device 553 may be fixed on the lower substrate 551. The flexible integrated circuit device 553 may be attached to the lower substrate 551 using an adhesion member (not illustrated). Here, the adhesion member may be interposed between an upper face of the lower substrate 551 and a bottom face of the flexible integrated circuit device 553 so that a connection terminal 555 of the flexible integrated circuit device 553 may be exposed. In example embodiments, the flexible integrated circuit device 553 may be fixed on the lower substrate 551 by a transfer process. For example, the flexible integrated circuit device 553 may be attached to the lower substrate 551 using the adhesion member such as a tape for die bonding or a double-sided tape.

Hereinafter, the transfer process for fixing the flexible integrated circuit device 553 to the lower substrate 551 will be described.

Figure 10:
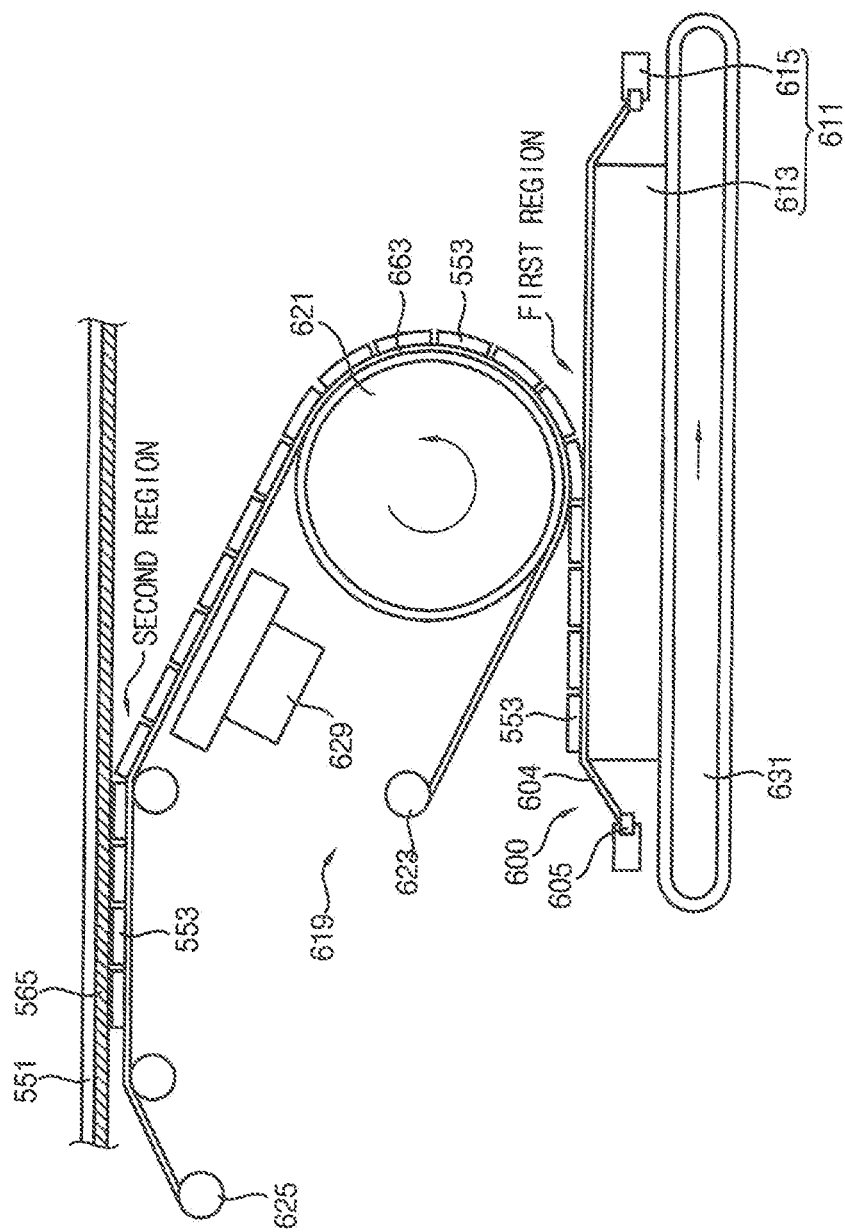
FIG. 10 is a cross-sectional view illustrating a transfer and adhesion process in accordance with example embodiments of the invention.

FIG. 10 is a cross-sectional view illustrating a transfer and adhesion process in accordance with example embodiments of the invention.

Referring to FIG. 10, there is provided a transfer substrate 600 including a first adhesive tape 604 on which the flexible integrated circuit device 553 is attached. After an ultraviolet (UV) ray irradiation process or a heating process, the first adhesive tape 604 may have a slightly reduced adhesive strength than an initial adhesive strength of the first adhesive tape 604. Considering this problem, the first adhesive tape 604 may include a curable adhesive which may have a substantially increased adhesive strength after the heating process or the UV ray irradiation process. For example, the first adhesive tape 604 may include a thermally curable adhesive tape or a UV curable adhesive tape.

A peripheral portion of the first adhesive tape 604 may be supported by a ring frame 605. Thus, the transfer substrate 600 having the flexible integrated circuit device 553 may be located on a plate 611 wherein the flexible integrated circuit device 553 may be attached on the first adhesive tape 604 having the peripheral portion supported by the ring frame 605. The plate 611 having the transfer substrate 600 including the flexible integrated circuit device 553 attached on the first adhesive tape 604 may apply a predetermined tension to the first adhesive tape 604 while supporting the ring frame 605 by upwardly and downwardly moving a chuck table 613 using a frame supporting member 615. When this tension is applied to the first adhesive tape 604, the flexible integrated circuit device 553 may be easily detached from the first adhesive tape 604.

The plate 611 may transport the transfer substrate 600 along a first direction. For example, the plate 611 may move the transfer substrate 600 using a transfer member 631 although the plate may transport the transfer substrate 600 by its movement.

A second adhesive tape 663 may be provided onto the flexible integrated circuit device 553 and may be collected from the flexible integrated circuit device package 553 along a circumference of a roller 621 of an attachment and detachment member 619. Here, the roller 621 of the attachment and detachment member 619 may rotate from the first direction to a second direction. For example, the second adhesive tape 663 may include a curable tape such as a thermally curable adhesive tape or a UV curable adhesive tape substantially the same as or similar to the first adhesive tape 604. Meanwhile, because the UV irradiation process or the heating process is not performed about the second adhesive tape 663, the second adhesive tape 663 may have an adhesive strength substantially higher than that of the first adhesive tape 604.

While transferring the plate 611 in the first direction, the attachment and detachment member 619 may rotate from the first direction to the second direction so that the attachment and detachment member 619 may make contact with the flexible integrated circuit device 553 attached on the transfer substrate 600. In this case, the second adhesive tape 663 supplied from the attachment and detachment member 619 may have an adhesive strength substantially higher that that of the first adhesive tape 604 on which the flexible integrated circuit device 553 is attached. Additionally, the tension is applied to the first adhesive tape 604. As a result, the flexible integrated circuit device 553 may be transferred and attached on the second adhesive tape 663 from the first adhesive tape 604.

After the flexible integrated circuit device 553 is attached on the second adhesive tape 663 of the attachment and detachment member 619, the flexible integrated circuit device 553 may rotate from the first direction toward the second direction in accordance with the rotation of the roller 621 of the attachment and detachment member 619. Here, the adhesive strength of the second adhesive tape 663 may be decreased using an adhesive strength reduction member 629. For example, an UV ray irradiation process or a heating process may be performed about the second adhesive tape 663 using the adhesive strength reduction member 629. Hence, the second adhesive tape 663 may have an adhesive strength substantially lower than an initial strength thereof.

As illustrated in FIG. 10, the flexible integrated circuit device 553 may make contact with a lower substrate 551 moving along the second direction in a second region after the flexible integrated circuit device 553 may be attached on the second adhesive tape 663 in the first region. That is, the flexible integrated circuit device 553 attached on the second adhesive tape 663 may contact the lower substrate 551 in the second region by rotating the attachment and detachment member 619 from the first direction toward the second direction while moving the lower substrate 551 in the second direction. Here, since the adhesion member 565 on the lower substrate 551 may have an adhesive strength substantially higher than the adhesive strength of the second adhesive film 663, the flexible integrated circuit device 553 may be transferred and attached on the lower substrate 551 from the second adhesive tape 551. The adhesion member 565 may fix the flexible integrated circuit device 553 on the lower substrate 551 and may include, for example, a tape for die bonding or a double-sided tape. As a result, the flexible integrated circuit device 553 may be transferred and attached on the lower substrate 551 from the first adhesive tape 604 of the transfer substrate 600 through the second adhesive tape 663.

Referring to FIG. 9 again, an upper substrate 557 may be combined with the lower substrate 551 having the flexible integrated circuit device 553 thereon. The upper substrate 557 may include a substantially integrally formed connection pad (not illustrated). For example, the upper substrate 557 may include a flexible printed circuit board. The upper substrate 557 may be combined with the lower substrate 551 by interposing an anisotropic conductive film (not illustrated) therebetween. Thus, the connection pad of the upper substrate 557 may be electrically connected to the connection terminal of the flexible integrated circuit device 553 through the anisotropic conductive film.

In example embodiments, the upper substrate 557 may be attached to the lower substrate 551 by a compression process using at least one roller 171. For example, while transferring the lower substrate 551 having the flexible integrated circuit device 553 and the upper substrate 557 having the anisotropic conductive film among the rollers 171, the upper substrate 557 may be compressed to be combined with the lower substrate 551.

After combining the lower substrate 551 with the upper substrate 557, a thermal compression process may be performed about the anisotropic conductive film in order to improve the adhesive strength of the anisotropic conductive film and to substantially uniformly distribute conductive particles of the anisotropic conductive film. Therefore, a flexible integrated circuit device package 500 having a configuration substantially the same as that illustrated in FIG. 5 may be manufactured. This thermal compression process may be carried out using at least one roller 173 which may heat the anisotropic conductive film interposed between the lower substrate 551 and the upper substrate 551. In case that the thermal compression process is executed at a temperature below 100° C., the efficiency of the process may be poor because the anisotropic conductive film may not be sufficiently heated. When the thermal compression process is carried out at a temperature above 200° C., thermal stresses may be generated in the flexible integrated circuit device 553, the lower substrate 551 and the upper substrate 557. Accordingly, the thermal compression process may be performed at a temperature in a range of about 100° C. to about 200° C. The lower substrate 551 may include polyimide or metal and the upper substrate 557 may include polyimide so as to ensure a proper heat resistance during the thermal compression process. When the lower substrate 551 includes metal, the lower substrate 551 may have a proper heat dissipation property for the flexible integrated circuit device package 500 as well as the sufficient heat resistance. Further, when the upper substrate 557 includes polyimide, the connection pad may be integrally formed with the upper substrate 557.

As described above, the lower substrate 551 and the upper substrate 557 may be combined each other by the compression process using the rollers 173 after fixing the flexible integrated circuit device 553 to the lower substrate 551. Then, the flexible integrated circuit device package 500 may be obtained by performing the thermal compression process about the anisotropic conductive film. Here, an additional adhesion member for attaching of the upper substrate 557 may be omitted because the anisotropic conductive film may have an enhanced adhesive strength.

In the flexible integrated circuit device package and the method thereof according to example embodiments, all the components such as the flexible integrated circuit device, the lower substrate and the upper substrate may have flexible materials such that the flexible integrated circuit device package may be totally bent or folded as required. When such flexible integrated circuit device package is employed in a memory card system having a flexible case, the memory card system may also be entirely bent or folded as demanded so that the memory card system may be employed in various electronic apparatuses. Further, because the adhesion member may not be required when the anisotropic conductive film is used, the flexible integrated circuit device package may have a simpler configuration and may ensure a more improved structural stability.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A memory card system comprising:
a flexible integrated circuit device package including a material capable of being bent or folded, the flexible integrated circuit device package comprising a flexible integrated circuit device having a connection pad for an electrical connection;
an upper flexible case including a material capable of being bent or folded, the upper flexible case covering the integrated circuit device package;
a lower flexible case including a material capable of being bent or folded, the flexible integrated circuit device package being fixed to the lower flexible case;
a wiring structure including a material capable of being bent or folded, the wiring structure comprising a connection wiring disposed on an inner surface of the upper flexible case for electrically connecting the flexible integrated circuit device package with an external device, a connection pin disposed on an outer surface of the upper flexible case, and a via wiring passing through the upper flexible case; and
an anisotropic conductive film disposed between the flexible integrated circuit device package and the upper flexible case for electrically connecting the connection pad with the connection wiring.

2. The memory card system of claim 1, wherein the flexible integrated circuit device package comprises a semiconductor chip, a lower substrate disposed under the semiconductor chip, and an upper substrate disposed on the semiconductor chip, and wherein the connection pad is disposed on the upper substrate.

3. The memory card system of claim 2, wherein the connection pad includes a via pad passing through the upper substrate from the semiconductor chip.

4. The memory card system of claim 3, wherein the connection pad includes an anisotropic conductive film disposed between the semiconductor chip and the upper substrate so as to electrically connect the semiconductor chip with the via pad along one direction.

5. The memory card system of claim 1, wherein the upper flexible case includes polyimide.

6. The memory card system of claim 1, wherein the lower flexible case includes polyimide or metal.

7. The memory card system of claim 6, wherein the metal includes copper, aluminum, gold or an alloy thereof.

8. The memory card system of claim 1, further comprising an adhesion member disposed between the flexible integrated circuit device package and the lower flexible case so as to fix the flexible integrated circuit device package to the lower flexible case.

9. A flexible integrated circuit device package comprising:
a lower substrate including a flexible material capable of being bent or folded;
a flexible integrated circuit device disposed on the lower substrate, the flexible integrated circuit device including a flexible material capable of being bent or folded and comprising a connection terminal for an electrical connection;
an upper substrate including flexible material capable of being bent or folded and comprising a connection pad electrically connected to the connection terminal; and
an anisotropic conductive film disposed between the flexible integrated circuit device and the upper substrate to electrically connect the connection terminal with the connection pad in one direction.

10. The flexible integrated circuit device package of claim 9, wherein the flexible integrated circuit device has a thickness in a range of 1 μm to 50 μm.

11. The flexible integrated circuit device package of claim 9, wherein the upper substrate includes polyimide, and the connection pad comprises a via wiring passing through the upper substrate and an extended wiring connected to the via wiring and extended along an inner surface of the upper substrate.

12. The flexible integrated circuit device package of claim 9, further comprising an adhesion member disposed between the lower substrate and the flexible integrated circuit device to fix the flexible integrated circuit device on the lower substrate.

* * * * *